(12) United States Patent
Pedoeem et al.

(10) Patent No.: US 11,963,329 B2
(45) Date of Patent: Apr. 16, 2024

(54) APPARATUS FOR COOLING ELECTRONIC CIRCUITRY

(71) Applicant: Crestron Electronics, Inc., Rockleigh, NJ (US)

(72) Inventors: Albert Pedoeem, West Orange, NJ (US); William Miranda, Rockleigh, NJ (US); William Rehak, Oradell, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 0 days.

(21) Appl. No.: 17/949,416

(22) Filed: Sep. 21, 2022

(65) Prior Publication Data

US 2023/0017540 A1 Jan. 19, 2023

Related U.S. Application Data

(63) Continuation of application No. 16/891,130, filed on Jun. 3, 2020, now Pat. No. 11,464,134.

(51) Int. Cl.
*H05K 7/20* (2006.01)

(52) U.S. Cl.
CPC ............................ *H05K 7/20145* (2013.01)

(58) Field of Classification Search
CPC ........... H05K 7/20136; H05K 7/20154; H05K 7/20172; H05K 7/20145
USPC ................. 361/679.48, 679.46, 690; 454/184
See application file for complete search history.

(56) References Cited

U.S. PATENT DOCUMENTS

| 4,062,273 | A | * | 12/1977 | O'Connor | B61D 27/009 |
| | | | | | 454/105 |
| 5,564,980 | A | * | 10/1996 | Becker | F24F 7/08 |
| | | | | | 454/252 |
| 5,694,294 | A | * | 12/1997 | Ohashi | G06F 1/203 |
| | | | | | 361/679.48 |
| 6,458,028 | B2 | * | 10/2002 | Snyder | F04D 25/088 |
| | | | | | 454/292 |
| 7,525,799 | B2 | * | 4/2009 | Lai | H05K 7/20572 |
| | | | | | 361/695 |

(Continued)

*Primary Examiner* — Ko-Wei Lin
(74) *Attorney, Agent, or Firm* — Crestron Electronics, Inc.

(57) ABSTRACT

Described herein are systems, modes, and methods for an electronics enclosure cooling apparatus comprising a plurality of air intake holes located on at least one surface of the enclosure, a plurality of air exhaust holes located on at least one surface of the enclosure different from that of the surface wherein the air intake holes are located, an air plenum piece that comprises a substantially planar portion and a hole located on the substantially planar portion, the air plenum piece of such dimension and placement within the enclosure such that a first volume of the interior is created and a second volume of the interior is created, and wherein the air plenum piece is further adapted to create an air channel that substantially separates the first volume of the interior of the enclosure from the second volume of the interior, and wherein the first volume is in fluid engagement with the plurality of air intake holes, and further wherein the second volume is in fluid engagement with the plurality of air exhaust holes; and a fan located in coaxial alignment with the hole of the air plenum piece such that the fan is adapted to draw air from an exterior of the enclosure through the plurality of air intake holes, into the first volume, out through the second volume, and out through the plurality of air exhaust holes.

4 Claims, 5 Drawing Sheets

(56) References Cited

U.S. PATENT DOCUMENTS

| | | | | |
|---|---|---|---|---|
| 7,643,293 B2* | 1/2010 | Chu | | F28D 15/0275 |
| | | | | 361/679.48 |
| 7,869,212 B2* | 1/2011 | Kong | | H01L 23/467 |
| | | | | 361/679.48 |
| 8,462,505 B2* | 6/2013 | Nagami | | B23K 9/1006 |
| | | | | 219/133 |
| 8,570,742 B2* | 10/2013 | Yeh | | G06F 1/20 |
| | | | | 361/679.48 |
| 8,634,193 B2* | 1/2014 | Zhou | | H05K 7/20127 |
| | | | | 361/679.48 |
| 8,964,374 B1* | 2/2015 | Sheng | | H05K 7/20836 |
| | | | | 361/679.49 |
| 8,988,878 B2* | 3/2015 | Lin | | G06F 1/203 |
| | | | | 361/679.48 |
| 9,170,615 B2* | 10/2015 | Wilke | | H05K 7/20727 |
| 9,557,785 B2* | 1/2017 | Lin | | G06F 1/20 |
| 9,764,347 B2* | 9/2017 | Nudelman | | B05B 16/60 |
| 2008/0232063 A1* | 9/2008 | Koo | | G06F 1/203 |
| | | | | 361/679.48 |
| 2009/0103265 A1* | 4/2009 | Hongo | | G06F 1/203 |
| | | | | 361/690 |
| 2012/0020014 A1* | 1/2012 | Chang | | H05K 7/20727 |
| | | | | 361/679.48 |
| 2012/0100795 A1* | 4/2012 | Ishimine | | F24F 13/0227 |
| | | | | 165/104.34 |
| 2012/0121487 A1* | 5/2012 | Jewell-Larsen | | H01L 23/467 |
| | | | | 422/171 |
| 2012/0129442 A1* | 5/2012 | Wei | | H05K 7/1497 |
| | | | | 454/184 |
| 2012/0276834 A1* | 11/2012 | Peng | | H05K 7/20745 |
| | | | | 454/184 |
| 2013/0045671 A1* | 2/2013 | Apple | | F24F 11/0001 |
| | | | | 454/239 |
| 2013/0050942 A1* | 2/2013 | Konishi | | H05K 7/20127 |
| | | | | 361/692 |
| 2014/0235156 A1* | 8/2014 | Li | | H05K 7/20154 |
| | | | | 454/184 |
| 2014/0362529 A1* | 12/2014 | Tsuchida | | H05K 7/20127 |
| | | | | 361/690 |
| 2015/0017905 A1* | 1/2015 | Li | | H05K 7/20163 |
| | | | | 454/184 |
| 2015/0065029 A1* | 3/2015 | Leckelt | | F24F 11/0001 |
| | | | | 454/184 |
| 2015/0109733 A1* | 4/2015 | Horiuchi | | H05K 7/20136 |
| | | | | 361/695 |
| 2015/0156917 A1* | 6/2015 | Ogawa | | H05K 7/20136 |
| | | | | 361/695 |
| 2015/0195952 A1* | 7/2015 | Tsunoda | | G06F 1/203 |
| | | | | 361/690 |
| 2016/0088760 A1* | 3/2016 | Yukito | | H05K 7/20136 |
| | | | | 361/679.48 |
| 2016/0124473 A1* | 5/2016 | Lin | | H05K 7/20136 |
| | | | | 361/679.49 |
| 2016/0143180 A1* | 5/2016 | Zhu | | H05K 7/20572 |
| | | | | 165/80.2 |
| 2017/0083058 A1* | 3/2017 | Janak | | G06F 1/20 |
| 2017/0155984 A1* | 6/2017 | Ting | | H04R 1/2811 |
| 2018/0298921 A1* | 10/2018 | Niemann | | F28F 3/04 |
| 2019/0165552 A1* | 5/2019 | Kin | | H05K 7/1432 |
| 2019/0339748 A1* | 11/2019 | Keilers | | G06F 1/20 |
| 2019/0373765 A1* | 12/2019 | Naito | | H05K 7/20172 |
| 2020/0091572 A1* | 3/2020 | Yokote | | H01M 10/613 |
| 2020/0091688 A1* | 3/2020 | Shindo | | H02B 1/30 |
| 2020/0251406 A1* | 8/2020 | Trotman | | F04D 29/522 |

\* cited by examiner

VIEW A-A

VIEW B-B

APPARATUS FOR COOLING ELECTRONIC CIRCUITRY

PRIORITY INFORMATION

The present application claims priority under 35 U.S.C. § 120 as a continuation application to U.S. Non-Provisional patent application Ser. No. 16/891,130, filed Jun. 3, 2020 (and which will issue on Oct. 4, 2022, as U.S. Pat. No. 11,464,134); U.S. Pat. No. 11,464,134 claims priority under 35 U.S.C. § 120 as a continuation application to U.S. Non-Provisional patent application Ser. No. 15/602,334, filed May 23, 2017; and U.S. Non-Provisional patent application Ser. No. 15/602,334 claims priority under 35 U.S.C. § 119(e) to U.S. Provisional Patent Application Ser. No. 62/345,169, filed Jun. 3, 2016, the contents of all of which are expressly incorporated herein in their entirety by reference.

CROSS REFERENCE TO RELATED APPLICATIONS

Related subject matter is disclosed in co-owned U.S. Non-Provisional patent application Ser. Nos. 15/602,334, 16/534,398, 16/891,130, 17/375,045, and 17/497,042.

BACKGROUND

Technical Field

Aspects of the embodiments relate generally to rack mounted equipment housings, and more specifically to systems, methods, and modes for cooling of circuitry located within rack mounted equipment housings that substantially eliminates or prevents problems associated with currently available technology.

Background Art

As those of skill in the art of the design, manufacture, and sale of electronic equipment can no doubt appreciate, fans are sometimes necessary to cool integrated circuits, such as those use in transmitters and receivers sold in Digital Media (DM) products manufactured by Crestron Electronics, Inc., of Rockleigh, NJ, due to their high thermal dissipation levels. Typically, fans are located either to the side of the high wattage device, or right above the high wattage device in order to cool the device effectively, or at least to try and cool the device effectively. A typical installation places the vent holes in the container housing (housing) right above the fan. This approach introduces several drawbacks: If the vent holes are blocked during installation, this will result in overheating the equipment. This is a likely scenario when equipment is installed behind the display. In addition, placing the fan right behind the vent holes causes high acoustic noise. Further, the fan may be visible from outside of the housing, detracting from the aesthetic appearance of the device.

Accordingly, a need has arisen for systems, methods, and modes for cooling of circuitry located within rack mounted equipment housings that substantially eliminates or prevents problems associated with currently available technology.

SUMMARY

It is an object of the embodiments to substantially solve at least the problems and/or disadvantages discussed above, and to provide at least one or more of the advantages described below.

It is therefore a general aspect of the embodiments to provide systems, methods, and modes for cooling of circuitry located within rack mounted equipment housings that substantially eliminates or prevents problems that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, an electronics enclosure cooling apparatus is provided, comprising: a plurality of air intake holes located on at least one surface of the enclosure; a plurality of air exhaust holes located on at least one surface of the enclosure different from that of the surface wherein the air intake holes are located; an air plenum piece that comprises a substantially planar portion and a hole located on the substantially planar portion, the air plenum piece of such dimension and placement within the enclosure such that a first volume of the interior is created and a second volume of the interior is created, and wherein the air plenum piece is further adapted to create an air channel that substantially separates the first volume of the interior of the enclosure from the second volume of the interior, and wherein the first volume is in fluid engagement with the plurality of air intake holes, and further wherein the second volume is in fluid engagement with the plurality of air exhaust holes; and a fan located in coaxial alignment with the hole of the air plenum piece such that the fan is adapted to draw air from an exterior of the enclosure through the plurality of air intake holes, into the first volume, out through the second volume, and out through the plurality of air exhaust holes.

According to the first aspect of the embodiments, the plurality of air exhaust holes is not adjacent to the air intake holes such that substantially no exhaust air can be drawn into the plurality air intake holes.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

DETAILED DESCRIPTION

Figure 1:
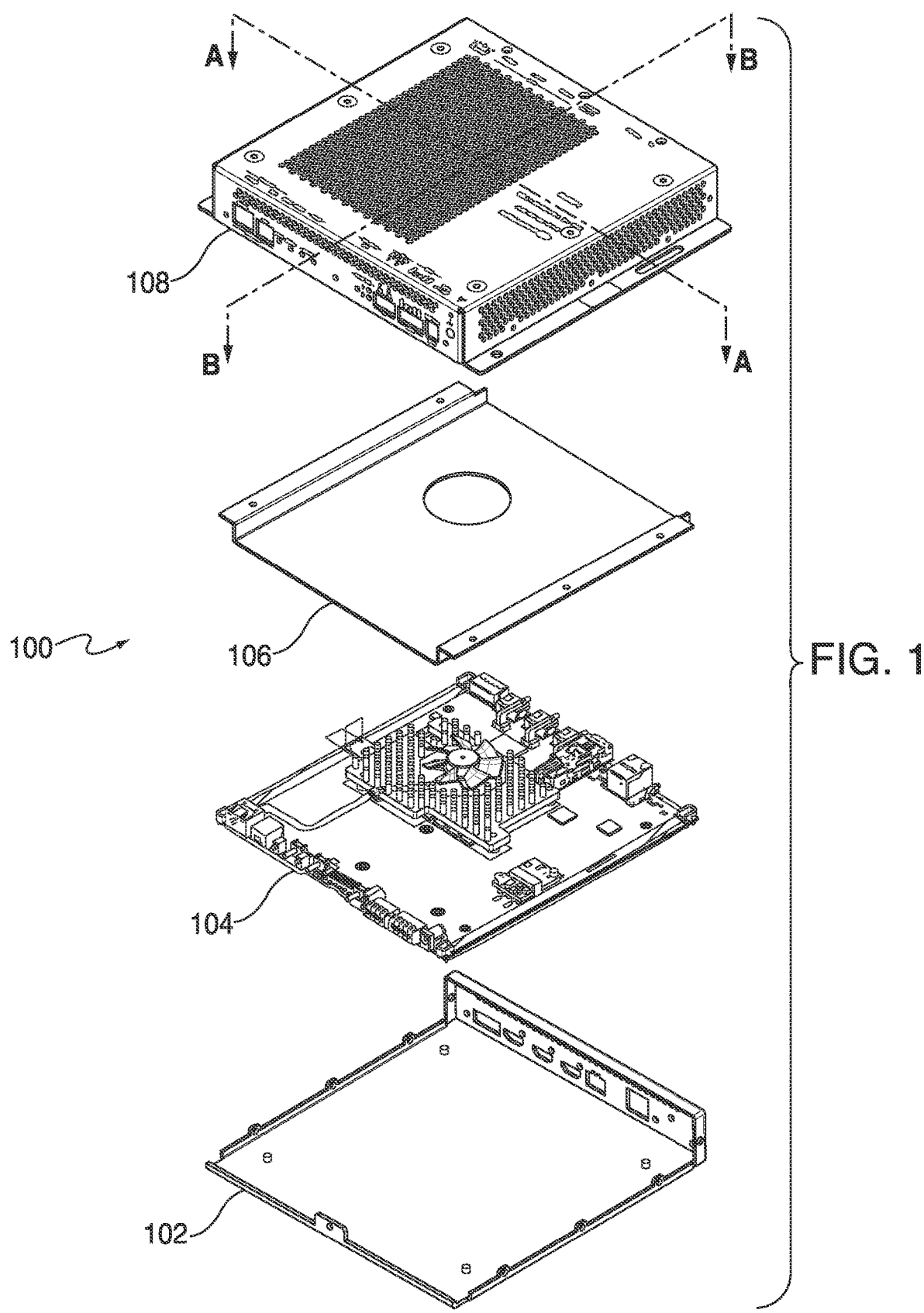
FIG. 1 illustrates an exploded perspective view of a housing of electronic circuitry in which a cooling apparatus has been implemented according to aspects of the embodiments.
Figure 2A:
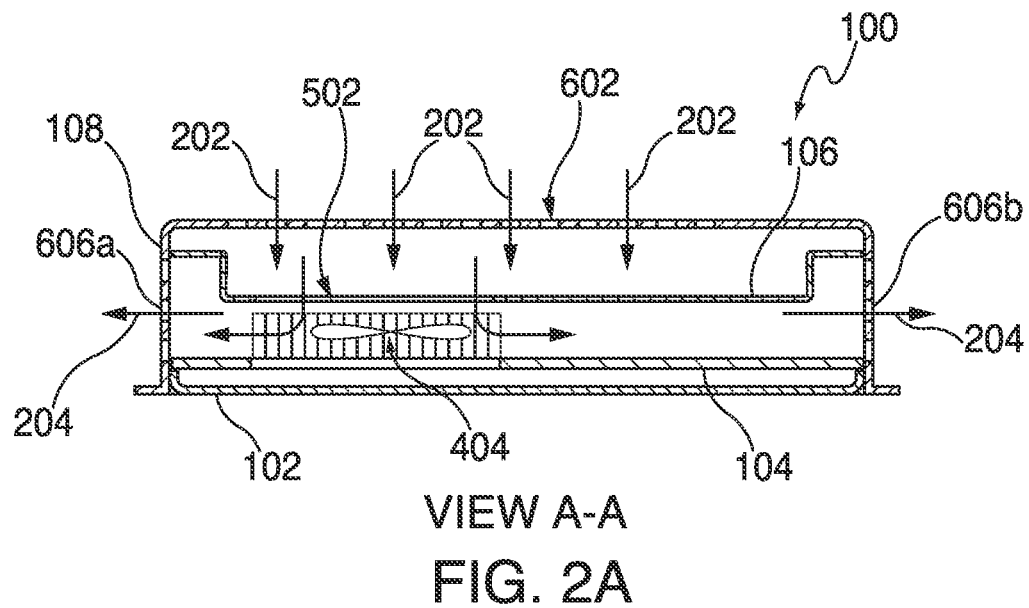
FIG. 2A illustrates a sectional view along lines A-A of FIG. 1 of the cooling apparatus according to aspects of the embodiments.
Figure 2B:
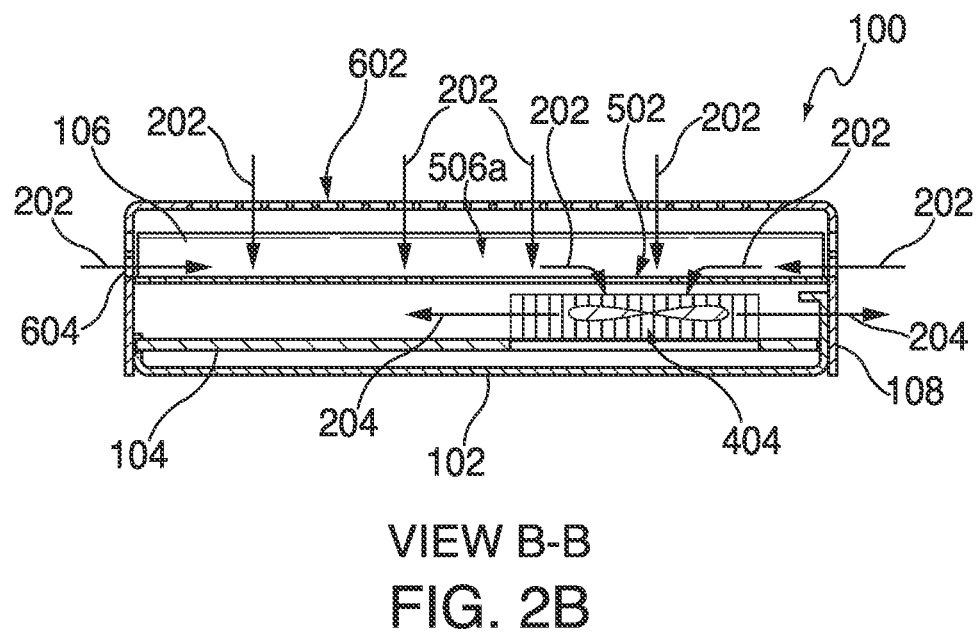
FIG. 2B illustrates a sectional view along lines B-B of FIG. 1 of the cooling apparatus according to aspects of the embodiments.

The embodiments are described more fully hereinafter with reference to the accompanying drawings, in which aspects of the embodiments are shown. In the drawings, the size and relative sizes of layers and regions may be exaggerated for clarity. Like numbers refer to like elements throughout. The embodiments may, however, be embodied in many different forms and should not be construed as limited to the aspects of the embodiments set forth herein. Rather, these embodiments are provided so that this disclosure will be thorough and complete, and will fully convey the scope of the aspects of the embodiments to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as audio electronic devices.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" on "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.

100 Electronic Circuity Cooling Apparatus (Cooling Apparatus)
102 Lower Portion
104 Circuit Board with Cooling Fan (Circuit Board)
106 Air Plenum Piece (APP)
108 Upper Portion
202 Cooler Intake Air
204 Warmer Output Air
302 Rear Air Inlet
304 Rear Panel
306 Bottom Panel
402 Fan
404 Heat Sink
406 Circuitry
502 Air Plenum Hole (Hole)
504 Horizontal Surface
506 Vertical Wall
508 Plenum Planar Portion
510 Plenum Air Channel
512 Assembly Holes
602 Top Air Inlet
604 Front Air Inlet
606 Side Air Exhaust
608 Assembly Screws
610 Front Panel
612 Left Side Panel
614 Right Side Panel
616 Upper Panel List of Acronyms Used in the Specification in Alphabetical Order The following is a list of the acronyms used in the specification in alphabetical order.

APP Air Plenum Piece

The different aspects of the embodiments described herein pertain to the context of a cooling system for audio electronics, but is not limited thereto, except as may be set forth expressly in the appended claims.

For 40 years Creston Electronics Inc., has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein, as embodied as digital media products such as DM-TX-4K-1000-SFP (4K transmitter) and DM-RX-4K-1000-SFP (4K receiver), can be manufactured by Crestron Electronics Inc., located in Rockleigh, NJ, and have been marketed and sold under the registered trademark name of "DigitalMedia."

FIG. 1 illustrates an exploded perspective view of a housing of electronic circuitry in which a cooling apparatus has been implemented according to aspects of the embodiments. According to aspects of the embodiments, components of cooling apparatus 100 include both extraneous components, and the manner in which they have been implemented in design, but also intrinsic components, such as components of the housing assembly itself. This combination of devices will be described in greater detail below.

Figure 3:
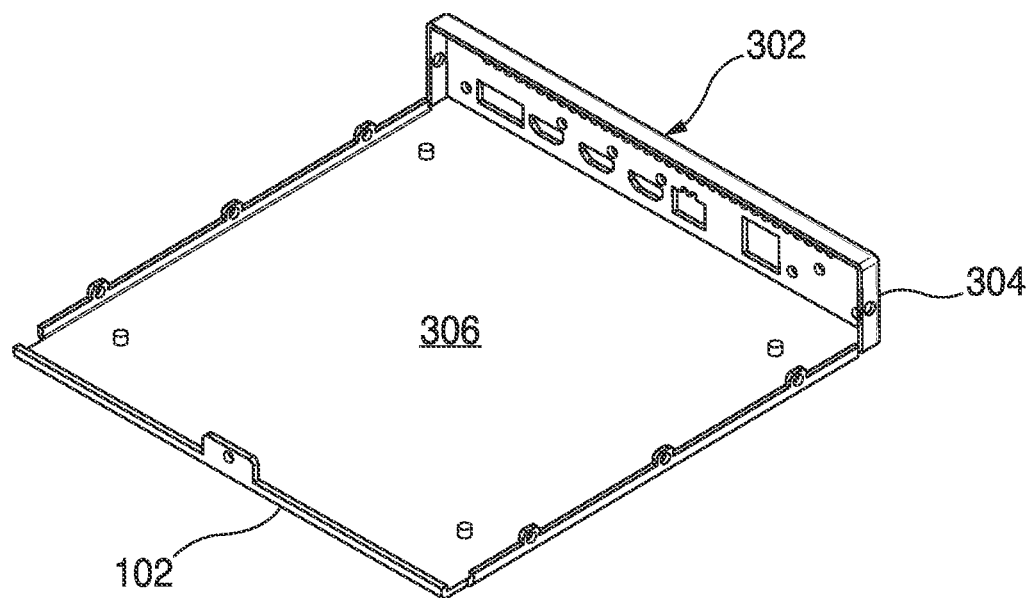
FIG. 3 illustrates a perspective view of a bottom portion of the cooling apparatus of FIGS. 1 and 2 according to aspects of the embodiments.
Figure 4:
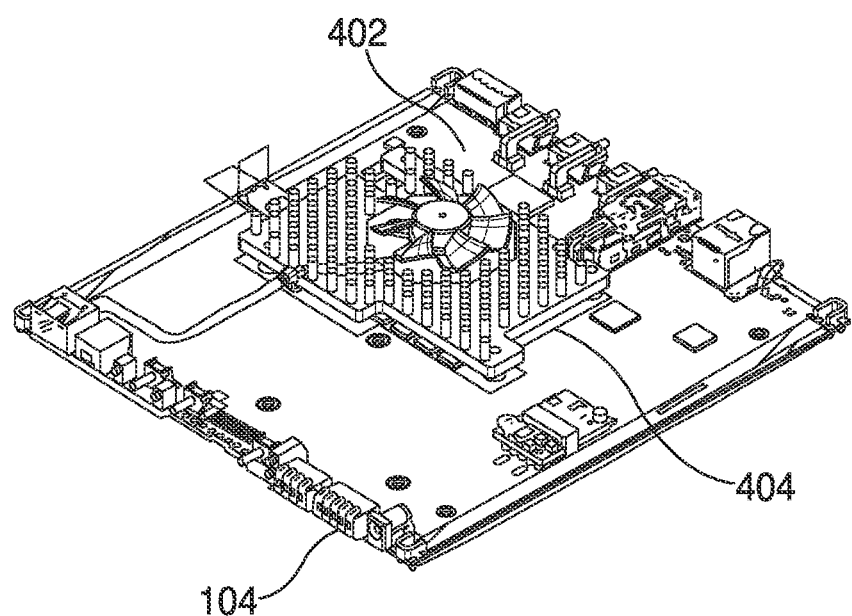
FIG. 4 illustrates a perspective view of an electronic printed circuit board with a cooling fan mounted thereupon according to aspects of the embodiments.
Figure 5A:
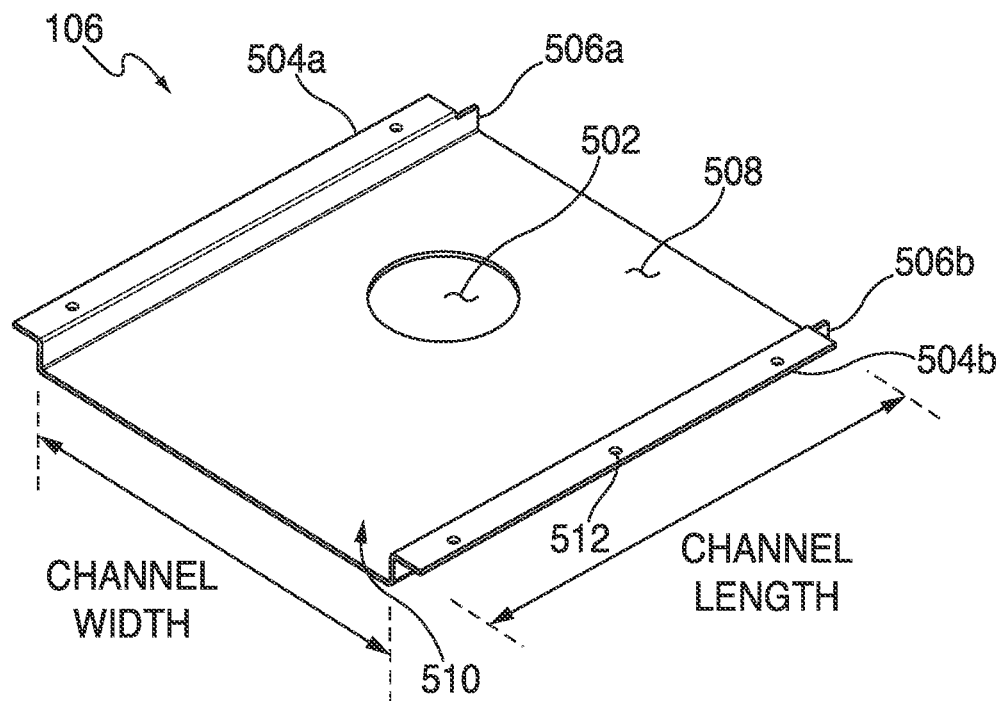
FIG. 5A illustrates a perspective view of an air plenum piece used in the cooling apparatus of FIGS. 1 and 2 according to aspects of the embodiments.
Figure 6:
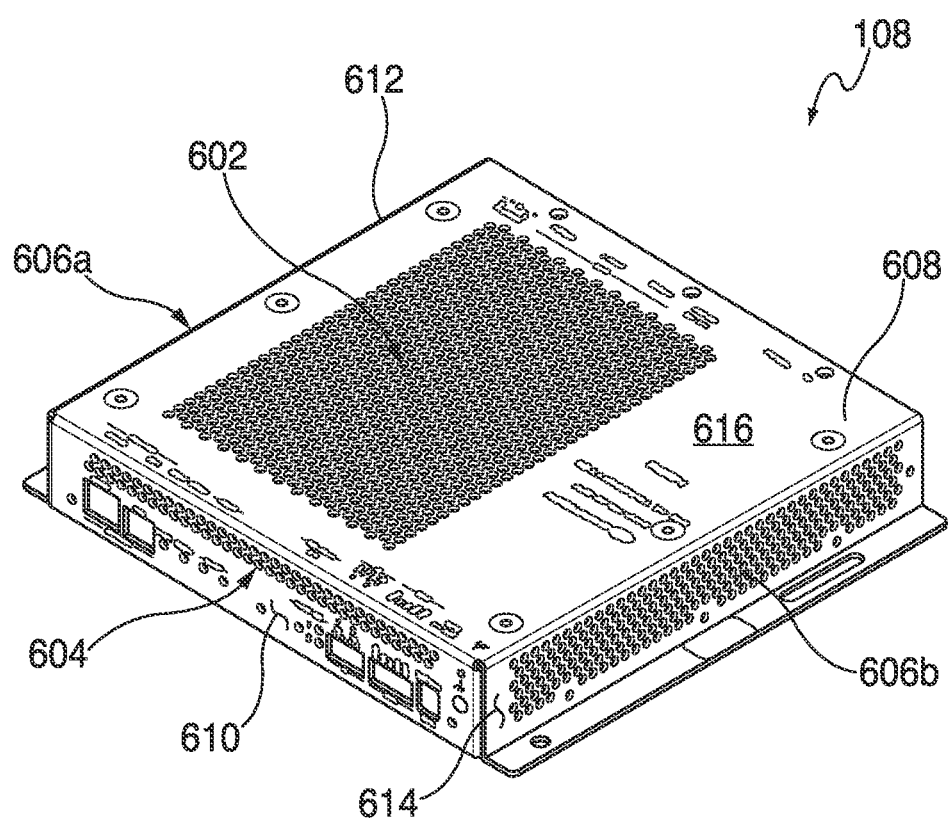
FIG. 6 illustrates a perspective view of an upper portion of the cooling apparatus of FIGS. 1 and 2 according to aspects of the embodiments.

Electronic circuitry cooling apparatus (cooling apparatus) 100 comprises lower portion 102, circuit board with cooling fan (circuit board) 104, air plenum piece (APP) 106, and upper portion 108. As shown in FIG. 3, which illustrates a perspective view of bottom portion 102 of cooling apparatus 100, lower portion 102 comprises rear air inlet 302, which is located on rear panel 304, and further comprises bottom panel 306 according to aspects of the embodiments. Shown in FIG. 4 is circuit board 104, which itself comprises cooling fan 402 located on top of heat sink 404 and circuitry 406, which is configured and arranged in a manner well known to those of skill in the art, and thus, in fulfillment of the dual purposes of clarity and brevity, a detailed discussion thereof has been omitted from herein. FIG. 5A illustrates APP 106, which comprises plenum planar portion 508, vertical tabs 506a,b, horizontal tabs 504a,b, and air plenum hole 502, located on plenum planar portion 508. In addition, APP 106 further comprises a plurality of mounting holes 512. APP 106 is adapted and shaped in the form of an elongated channel, and as such comprises channel 510 that includes a channel width and a channel length according to aspects of the embodiments. FIG. 6 illustrates upper portion 108, which comprises front panel 610, left side panel 612, right side panel 614, and upper panel 616. In addition, front panel 610 comprises front air inlets 604, left side panel 612 comprises side air exhaust 606a, and right side panel 614 comprises side air exhaust 606b according to aspects of the embodiments. Further, top portion 616 comprises top air inlet 602 according to aspects of the embodiments.

Described in several of the drawings are the nomenclatures that indicate relative position of "front," "rear," "side," "top," "bottom," and other such similar indicators of relative position. As those of skill in the art can appreciate, such indicators are not to be taken in a limiting sense, and are merely provided to make the discussion and description of the aspects of the embodiments spatially easier to understand, and to place pieces or components thereof in spatial or relative context with each other.

Attention is now directed to FIGS. 1, 2A, 2B, 5A, 5B, and 6. According to aspects of the embodiments, cooler intake air (intake air) 202 is drawn in from top air inlet 602, front air inlet 604, and rear air inlet 302 by operation of fan 402. As intake air 202 is drawn in, it is forced to travel on top of APP 106, because, as shown in FIGS. 1, 2A, 2B, and 5A, APP 106 has been designed and fabricated to substantially enclose the air intakes, separate them from the lower portion of the housing enclosure, and provide only one path for intake air 202 to travel as it is pulled in by fan 402; that is, APP 106 substantially seals the upper portion of the interior of the housing from the lower portion (anything below APP 106), which includes circuit board 104 and the upper surface of lower portion 102. Further, since all air intake holes (302, 602, 604) are located in that space that is defined by the upper level of APP 106 and the interior lower surface of upper portion 108, intake air 202 travels through channel 510 to hole 502 and fan 402, via operation of fan 402.

Intake air 202 is pulled through rear air inlet 302, top air inlet 602, and front air inlet 604, and then through hole 502 by fan 402, wherein it passes over and through heat sink 404 and circuitry 406 located on circuit board 104. As the air is expelled from fan 402 and passes over heat sink 404 and circuitry 406, it picks up heat, and becomes or transitions to warmer output air (output air) 204. Output air 204 is forced to be expelled through side air exhausts 606a,b according to aspects of the embodiments, as they are the only exhausts available for the warmer air to travel according to aspects of the embodiments.

According to aspects of the embodiments, air duct conduit system (cooling apparatus) 100 has been created such that air can be ducted to fan 402 from multiple air inlet ( ). Air exhaust vents 606a,b are located on the left and right side walls 612, 614, respectively. Having a plurality of surfaces with inlets 302, 602, 604 substantially prevents the possibility of over-heating due to blocked air inlets according to aspects of the embodiments. APP 106 contains a suitably sized hole 502 that is about the size of the diameter of the fan blades, and is spaced in close proximity to the fan blades.

In addition, APP 106 is sized and located such that it leaves a very small gap between APP 106 and the front and rear walls, so that air is drawn from the top surface 616, and front and rear walls 610, 304 according to aspects of the embodiments. According to further aspects of the embodiments, APP 106 of this configuration also reduces the amount of fan noise radiated from the container because the fan is located farther away from the exterior surface, and the intake air has a longer distance to travel prior to encountering the blades of fan 402; as those of skill in the art can appreciate, air intakes that are located relatively closer to the blades of a fan create more noise than when air intakes are located relatively farther away from the blades of the fan. Further, cooler intake air 202 is pulled in from multiple and larger 602, 604, 302 surfaces that further reduces the acoustic noise generated by the fan as those skilled in the art can appreciate. According to still further aspects of the embodiments, locating fan 402 farther away from inlets 302, 602, 604 lowers the pressure drop through the same inlets 302, 602, 604, which can be increased to accommodate greater cooling capacity; thus, more heat can be removed with a smaller fan than would otherwise be the case.

Figure 5B:
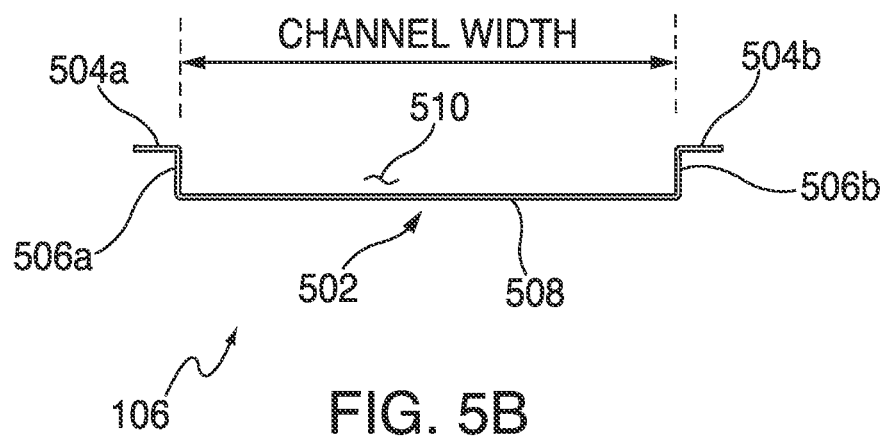
FIG. 5B illustrates a side view of the air plenum piece used in the cooling apparatus of FIGS. 1 and 2 according to aspects of the embodiments.

Attention is again directed to FIG. 5A, which illustrates a perspective view of APP 106 used in cooling apparatus 100 of FIGS. 1 and 2 according to aspects of the embodiments, and FIG. 5B, which illustrates a side view of APP 106 used in the cooling apparatus of FIGS. 1 and 2 according to aspects of the embodiments. As shown in FIGS. 5A and 5B, APP 106 comprises a substantially planar portion (plenum planar portion) 508, within which is located hole 502. Hole 502 is sized to be substantially similar in diameter to the diameter of the blades of fan 402, which, according to aspects of the embodiments, is located substantially coaxially in alignment with hole 502 (e.g., an imaginary line drawn through the center of hole 502 and the center of the fan blades would be substantially parallel and co-located in space and perpendicular to fan 402 and hole 502). On both sides of plenum planar portion 508 are located respective substantially vertical walls (walls) 506a,b, which form plenum air channel 510.

Plenum air channel 510 is the three dimensional space through which intake air 202 travels to get to hole 502 and fan 402. Plenum air channel 510 is formed not only by walls 506a,b, but also by rear panel 304 (FIG. 3; of lower portion 102) and front panel 610 (FIG. 6; of upper portion 108), according to aspects of the embodiments. According to aspects of the embodiments, it is the creation of plenum air channel 510 that causes the cool intake air 202 to be drawn into hole 502 by fan 402. As shown in FIGS. 5A and 5B, channel 510 has a length and width; due to the design and fabrication thereof, the channel length is approximately the interior linear distance from front panel 610 to rear panel 304 according to aspects of the embodiments. The channel width is the linear distance between first vertical wall 506a and second vertical wall 506b, as shown in FIG. 5B, according to aspects of the embodiments. The volume of channel 510 is defined by the product of the channel length, channel width, and channel depth (which is the height of vertical walls 506a,b), and has been sized to accommodate the amount of air that can be drawn in by fan 402 and required to maintain an adequate rate of cooling (or rate of heat dissipation) of the electronic circuitry located on circuit board 104.

FIG. 6 illustrates a perspective view of upper portion 108 of cooling apparatus 100 of FIGS. 1 and 2 according to aspects of the embodiments. As shown in FIG. 6, upper portion 108 comprises all but one of the sections of air intake and air exhaust holes. Upper portion 108 comprises top air inlet 602 (located on upper panel 616), front air inlet 604 (located on front panel 610), side air exhaust 606a (located on left side panel 612), and side air exhaust 606b (located on right side panel 614). While rear air inlet 302 is shown as being located on lower portion 102, those of skill in the art can appreciate that upper portion 108 could have been fabricated to encompass all four panels or walls, or the walls/could have been separately fabricated, among other possible combinations of assembly. According to still further aspects of the embodiments, APP 106 need not have oriented in the manner shown, but could also have had channel 510 cross in a direction perpendicular to that as shown; e.g., channel 510 could have run between left side panel 612 and right side panel 614, as opposed to running between front panel 610 and rear panel 304.

According to further aspects of the embodiments, the relative position and location of the air inlets as not being on a same surface of the air exhausts means that little or no hot exhaust air can be vacuumed into the air inlets; because of this configuration, only ambient air, or at least not hot air from the same enclosure will be pulled in by fan 402 through air inlets so that the cooling benefit of the moving air will be maximized. According to still further aspects of the embodiments, the relatively far distance between the blades of fan 402 and the air inlets means that the acoustical noise generated by the fan will be substantially minimized, and the cooling effectiveness substantially maximized. According to aspects of the embodiments, the height or distance of APP 106 above fan 402 can be about equal to the diameter of the blades of fan 402 in order to substantially minimize acoustical noise generated by fan 402.

As discussed in regard to one or more of the Figures described herein, reference is made to several dimensions, including several radii, angles, height, among others. Those of skill in the art can appreciate that although examples of dimensions are provided, these should not be taken in a limiting manner; that is, the aspects of the embodiments are not to be construed as defined or limited by the specific example of the dimensions shown and discussed, but instead are provided merely for illustrating an example of what a device that incorporates the aspects of the embodiments could, in a non-limiting manner, look like. Furthermore, as those of skill in the art can appreciate, since the aspects of the embodiments are directed towards a physical object, with dimensional characteristics, all of the parts will have various dimensions, some of which are not shown in fulfillment of the dual purposes of clarity and brevity. According to still further aspects of the embodiments, some of these objects will have dimensional characteristics that lend themselves to aesthetic aspects; in fulfillment of the dual purposes of clarity and brevity, dimensions in this regard have also been omitted. Therefore, as the aspects of the embodiments are directed towards a cooling apparatus for use with cooling electronic circuitry, it is to be understood that the dimensions of the different objects, some dimensions shown, some dimensions not shown, will be understood by those of skill in the art.

The disclosed embodiments provide systems, methods, and modes for cooling of circuitry located within rack mounted equipment housings. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

INDUSTRIAL APPLICABILITY

To solve the aforementioned problems, the aspects of the embodiments are directed towards systems, methods, and modes for cooling of circuitry located within rack mounted equipment housings that substantially eliminates or prevents problems associated with currently available technology.

Alternate Embodiments

Alternate embodiments may be devised without departing from the spirit or the scope of the different aspects of the embodiments.

What is claimed is:
1. A circuit housing apparatus, comprising:
a cuboid housing assembly (housing assembly) that includes an interior portion;
an air plenum piece located within the interior portion of the housing assembly to form a first interior portion and a second interior portion, the air plenum piece substantially isolating the first interior portion from the second interior portion except for a hole in the air plenum piece that fluidly interconnects the first interior portion to the second interior portion;
an electronic circuit that generates heat;
a fan located in substantially co-axial alignment with the hole in the air plenum piece, and wherein
the fan is adapted to draw cooling air from outside the housing assembly into fluid contact with the heat generating electronic circuit, whereupon the cooling air convectively receives heat from the electronic circuit to warm the cooling air, and wherein
the fan is further adapted to force the warmed cooling air to outside the housing assembly.

2. The circuit housing apparatus according to claim 1, further comprising:
   a first plurality of air intake holes adapted to pass cooling air into the second interior portion from outside the housing assembly; and
   a second plurality of air exhaust holes adopted to exhaust warmed cooling air from the first interior portion to outside the housing assembly.

3. The circuit housing apparatus according to claim 2, wherein
   the electronic circuit and fan are located in the first interior portion, and wherein
   the first plurality of air intake holes interfaces with the second interior portion only, and further wherein
   the second plurality of air exhaust holes interfaces with the first interior portion only.

4. The circuit housing apparatus according to claim 3, wherein
   the first plurality of air intake holes are adapted to not draw in heated exhaust air from the second plurality of air exhaust holes.

\* \* \* \* \*